United States Patent
Thalmayr et al.

(10) Patent No.: US 9,954,513 B1
(45) Date of Patent: Apr. 24, 2018

(54) METHODS AND APPARATUS FOR ANCHORING RESONATORS

(71) Applicant: Analog Devices, Inc., Norwood, MA (US)

(72) Inventors: Florian Thalmayr, Unterhaching (DE); Andrew Sparks, Cambridge, MA (US); Jan H. Kuypers, Rehau (DE)

(73) Assignee: Analog Devices, Inc., Norwood, MA (US)

( * ) Notice: Subject to any disclaimer, the term of this patent is extended or adjusted under 35 U.S.C. 154(b) by 1160 days.

(21) Appl. No.: 14/136,991

(22) Filed: Dec. 20, 2013

Related U.S. Application Data

(60) Provisional application No. 61/745,116, filed on Dec. 21, 2012.

(51) Int. Cl.
  *H03B 5/30* (2006.01)
  *H03H 9/02* (2006.01)
  *H03H 9/15* (2006.01)

(52) U.S. Cl.
  CPC .......... *H03H 9/02338* (2013.01); *H03B 5/30* (2013.01); *H03H 9/02228* (2013.01); *H03H 2009/155* (2013.01)

(58) Field of Classification Search
  CPC ......... H03H 2009/155; H03H 9/02228; H03H 9/02338; H03B 5/30
  USPC ..... 310/353, 351, 321, 313 R, 346; 331/154, 331/116 M
  See application file for complete search history.

(56) References Cited

U.S. PATENT DOCUMENTS

| | | |
|---|---|---|
| 2,410,825 A | 11/1946 | Lane |
| 4,139,793 A | 2/1979 | Michel |
| 4,443,728 A | 4/1984 | Kudo |
| 4,609,844 A | 9/1986 | Nakamura et al. |
| 4,900,971 A | 2/1990 | Kawashima |
| 5,001,383 A | 3/1991 | Kawashima |
| 5,025,346 A | 6/1991 | Tang et al. |

(Continued)

FOREIGN PATENT DOCUMENTS

| | | |
|---|---|---|
| WO | WO 98/01948 A1 | 1/1998 |
| WO | WO 02/17481 A2 | 2/2002 |

(Continued)

OTHER PUBLICATIONS

U.S. Appl. No. 14/199,103, filed Mar. 6, 2014, Thalmayr et al.

(Continued)

*Primary Examiner* — Arnold Kinkead
(74) *Attorney, Agent, or Firm* — Wolf, Greenfield & Sacks, P.C.

(57) ABSTRACT

Methods and apparatus for anchoring resonators, such as microelectromechanical systems (MEMS) resonators. A resonator may include a substrate, a mechanical resonating structure, and at least one anchor. The mechanical resonating structure may be configured to resonate in a resonance mode of vibration at a frequency. The anchor may couple the mechanical resonating structure to the substrate. The anchor may be configured to exhibit an acoustic bandgap at the frequency of the resonance mode of vibration of the mechanical resonating structure. The anchor may be oriented in a direction substantially parallel to a direction of propagation of the resonance mode of vibration of the mechanical resonating structure.

20 Claims, 9 Drawing Sheets

(56) References Cited

U.S. PATENT DOCUMENTS

| | | | |
|---|---|---|---|
| 5,640,133 | A | 6/1997 | MacDonald et al. |
| 5,914,553 | A | 6/1999 | Adams et al. |
| 6,124,765 | A | 9/2000 | Chan et al. |
| 6,739,190 | B2 | 5/2004 | Hsu et al. |
| 6,828,713 | B2 | 12/2004 | Bradley et al. |
| 6,909,221 | B2 | 6/2005 | Ayazi et al. |
| 6,930,569 | B2 | 8/2005 | Hsu |
| 6,943,484 | B2 | 9/2005 | Clark et al. |
| 6,954,020 | B2 | 10/2005 | Ma et al. |
| 6,985,051 | B2 | 1/2006 | Nguyen et al. |
| 6,995,622 | B2 | 2/2006 | Partridge et al. |
| 7,005,946 | B2 | 2/2006 | Duwel et al. |
| 7,211,926 | B2 | 5/2007 | Quevy et al. |
| 7,215,061 | B2 | 5/2007 | Kihara et al. |
| 7,352,608 | B2 | 4/2008 | Mohanty et al. |
| 7,492,241 | B2 | 2/2009 | Piazza et al. |
| 7,504,909 | B2 | 3/2009 | Tada |
| 7,667,369 | B2 | 2/2010 | Haskell et al. |
| 7,724,103 | B2 | 5/2010 | Feng et al. |
| 7,791,432 | B2 | 9/2010 | Piazza et al. |
| 7,886,575 | B2 | 2/2011 | Haskell et al. |
| 8,174,170 | B1 | 5/2012 | Kuypers et al. |
| 8,446,078 | B2 | 5/2013 | Bahreyni et al. |
| 8,624,471 | B1 * | 1/2014 | Ayazi ............... H03H 9/02338 310/351 |
| 8,887,568 | B2 | 11/2014 | Forke et al. |
| 9,299,910 | B1 * | 3/2016 | Sparks ............... H01L 41/053 |
| 2003/0117237 | A1 | 6/2003 | Niu et al. |
| 2004/0207492 | A1 | 10/2004 | Nguyen et al. |
| 2005/0073078 | A1 | 4/2005 | Lutz et al. |
| 2007/0013464 | A1 | 1/2007 | Pan et al. |
| 2007/0052498 | A1 | 3/2007 | Pan et al. |
| 2008/0143217 | A1 | 6/2008 | Ho et al. |
| 2008/0204153 | A1 | 8/2008 | Yoshida et al. |
| 2008/0272852 | A1 | 11/2008 | Six |
| 2009/0108381 | A1 | 4/2009 | Buchwalter et al. |
| 2009/0108959 | A1 | 4/2009 | Piazza et al. |
| 2009/0144963 | A1 | 6/2009 | Piazza et al. |
| 2009/0243747 | A1 | 10/2009 | Gaidarzhy et al. |
| 2009/0294638 | A1 | 12/2009 | Mohanty et al. |
| 2010/0007443 | A1 | 1/2010 | Mohanty et al. |
| 2010/0026136 | A1 | 2/2010 | Gaidarzhy et al. |
| 2010/0134207 | A1 | 6/2010 | Mohanty et al. |
| 2010/0155883 | A1 | 6/2010 | Wenzler et al. |
| 2010/0181868 | A1 | 7/2010 | Gaidarzhy et al. |
| 2010/0182102 | A1 | 7/2010 | Kuypers et al. |
| 2010/0314969 | A1 | 12/2010 | Gaidarzhy et al. |
| 2012/0074810 | A1 | 3/2012 | Chen et al. |
| 2012/0262242 | A1 | 10/2012 | van der Avoort et al. |
| 2012/0280594 | A1 | 11/2012 | Chen et al. |

FOREIGN PATENT DOCUMENTS

| | | |
|---|---|---|
| WO | WO 2006/000611 A1 | 1/2006 |
| WO | WO 2006/083482 A2 | 8/2006 |
| WO | WO 2006/124303 A1 | 11/2006 |
| WO | WO 2010/011288 A1 | 1/2010 |

OTHER PUBLICATIONS

Humad et al., "High frequency micromechanical piezo-on-silicon block resonators," Int'l Electron Devices Meeting 2003IEDM. Technical Digest, Washington, D.C. Dec. 8-10, 2003, New York, NY: IEEE US Dec. 8, 2003, pp. 957-960.

International Search Report and Written Opinion from International Application No. PCT/US2010/000921 dated Jul. 8, 2010.

International Search Report and International Preliminary Report on Patentability for PCT/US2006/021298 dated Nov. 6, 2006 and Dec. 6, 2007 respectively.

Kaajakari et al., "Square-Extensional Mode Single-Crystal Silicon Micromechanical Resonator for Low-Phase-Noise Oscillator Applications," *IEEE Electron Device Letters* 25(4):173 (2004).

Khine et al., "7MHz length-extensional SOI resonators with T-shaped anchors," Solid-State Sensors, Actuators and Microsystems Conference: Transducers, Piscataway, NJ, US, Jun. 21, 2009.

Piazza et al., "Low motional resistance ring-shaped contour-mode aluminum nitride piezoelectric micromechanical resonators for UHF applications," Micro Electro Mechanical Systems, 2005. MEMS 2005. 18th IEEE International Conference on Miami Beach, Florida, Jan. 30-Feb. 3, 2005, Piscataway, New Jersey, US, IEEE Jan. 30, 2005, pp. 20-23.

Tirole et al., "Lamb Waves Pressure Sensor Using an A N/Si Structure," Proceedings Ultrasonics Symposium, Oct. 31, 1993-Nov. 3, 1993, Baltimore, MD, IEEE 1993 vol. 1, pp. 371-374.

Sorenson, L. et al., One Dimensional Linear Acoustic Bandgap Structures for Performance Enhancement of ALN-On-Silicon Micromechanical Resonators, Solid-State Sensors, Actuators and Microsystems Conference (Transducers), 2011 16th International, pp. 918-921.

Hsu, Feng-Chia et al., Phononic Crystal strips for engineering Micromechanical Resonators, Proc. SPIE 8269, Photonic and Phononic Properties of Engineered Nanostructures II, Feb. 9, 2012.

* cited by examiner

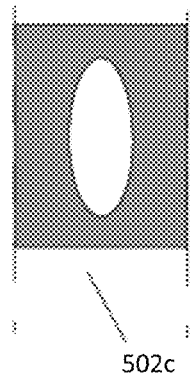
502c
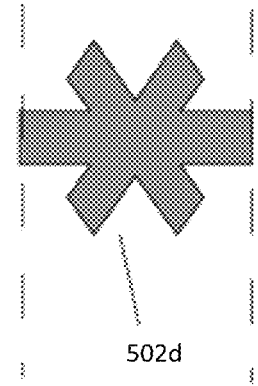
502d
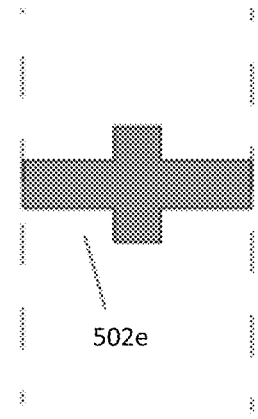
502e
FIG. 5C  FIG. 5D  FIG. 5E
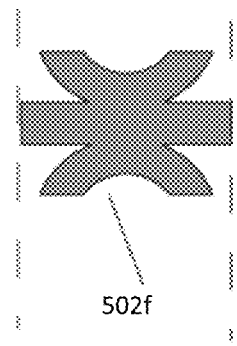
502f
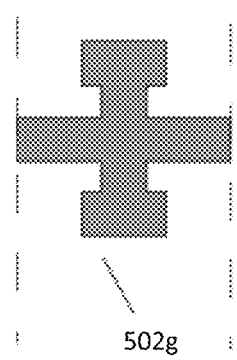
502g
FIG. 5F  FIG. 5G

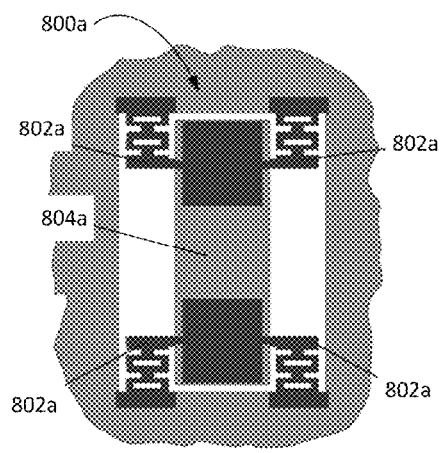
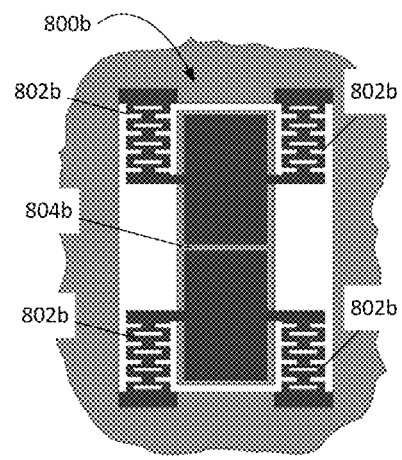
FIG. 8A
FIG. 8B
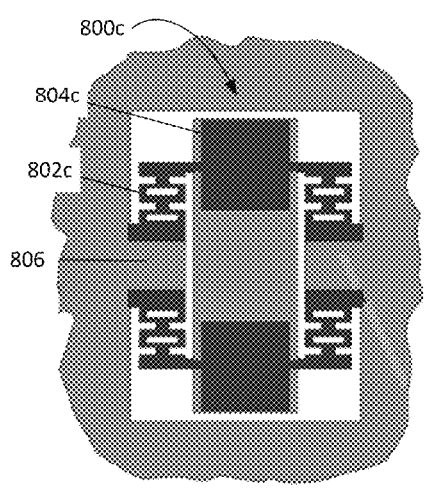
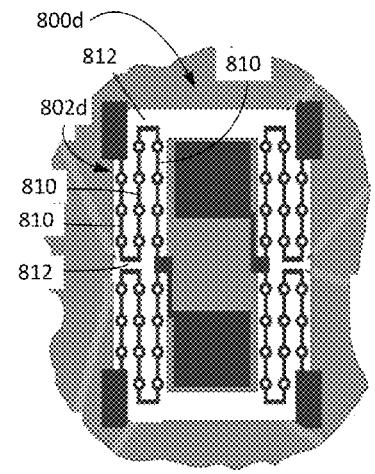
FIG. 8C
FIG. 8D

METHODS AND APPARATUS FOR ANCHORING RESONATORS

CROSS-REFERENCE TO RELATED APPLICATIONS

This Application claims the benefit under 35 U.S.C. § 119(e) of U.S. Provisional Application Ser. No. 61/745,116 entitled "RESONATORS COMPRISING PHONONIC CRYSTALS" filed on Dec. 21, 2012, which is hereby incorporated herein by reference in its entirety.

BACKGROUND

Field

The present application relates to anchoring a resonator, such as a microelectromechanical systems (MEMS) resonator, and to related apparatus and methods.

Related Art

Microelectromechanical systems (MEMS) are small mechanical structures with integrated electromechanical transducers to induce and/or detect their mechanical motion. Examples of MEMS devices include oscillators, accelerometers, gyroscopes, microphones, pressure sensors, switches, filters, and resonators. MEMS resonators may be used as resonators in, for example, oscillator circuits, acoustic frequency filters, acoustic sensors, gyroscopes, temperature sensors, and chemical sensors.

Important performance metrics of resonators, such as piezoelectric Lamb wave resonators, include the quality factor of the vibration and the absence of spurious vibrations close to the resonance frequency of the resonator.

BRIEF DESCRIPTION OF THE DRAWINGS

Various aspects and embodiments of the technology will be described with reference to the following figures. It should be appreciated that the figures are not necessarily drawn to scale. Items appearing in multiple figures are indicated by the same reference number in all the figures in which they appear.

FIG. 5C is a schematic illustration of another anchor structure, according to some embodiments;

FIG. 5D is a schematic illustration of another anchor structure, according to some embodiments;

FIG. 5E is a schematic illustration of another anchor structure, according to some embodiments;

FIG. 5F is a schematic illustration of another anchor structure, according to some embodiments;

FIG. 5G is a schematic illustration of another anchor structure, according to some embodiments;

FIG. 8A is a schematic illustration of a mechanical resonator with a repetitively structured anchor, according to some embodiments;

FIG. 8B is a schematic illustration of a mechanical resonator with a repetitively structured anchor, according to some embodiments;

FIG. 8C is a schematic illustration of a mechanical resonator with a repetitively structured anchor, according to some embodiments; and FIG. 8D is a schematic illustration of a mechanical resonator with a repetitively structured anchor, according to some embodiments.

SUMMARY

Figure 1A:
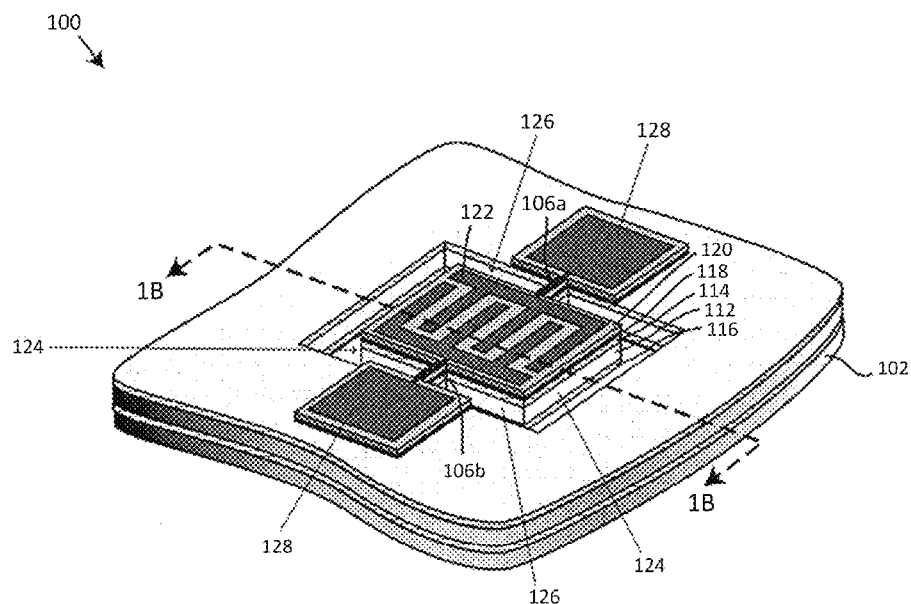
FIGS. 1A and 1B are schematic illustrations of, respectively, a perspective view and a cross-sectional view of a mechanical resonator, according to a non-limiting embodiment of the present disclosure.

According to an aspect of the present disclosure, an apparatus is provided, comprising a substrate, a microelectromechanical systems (MEMS) resonating structure configured to resonate in an in-plane mode of vibration at a first frequency and to resonate in a second mode of vibration at a second frequency, and a phononic crystal anchor coupling the MEMS resonating structure to the substrate, wherein the phononic crystal anchor is configured to exhibit an acoustic bandgap at the first frequency of the in-plane mode of vibration of the MEMS resonating structure, wherein the phononic crystal anchor is configured to resonate in a mode of vibration at a frequency substantially equal to the second frequency of the second mode of vibration of the MEMS resonating structure, and wherein the phononic crystal anchor is oriented in a direction substantially parallel to a direction of propagation of the in-plane mode of vibration of the MEMS resonating structure.

According to another aspect of the present disclosure, an apparatus is provided, comprising a substrate, a mechanical resonating structure configured to resonate in a first mode of vibration at a first frequency and to resonate in a second mode of vibration at a second frequency, and an anchor coupling the mechanical resonating structure to the substrate, wherein the anchor is configured to exhibit an acoustic bandgap at the first frequency of the first mode of vibration of the mechanical resonating structure, and wherein the anchor is configured to not exhibit an acoustic bandgap at the second frequency of the second mode of vibration of the mechanical resonating structure.

According to another aspect of the present disclosure, an apparatus is provided, comprising a substrate, a mechanical resonating structure configured to resonate in a resonance mode of vibration at a frequency, and an anchor coupling the mechanical resonating structure to the substrate, wherein the anchor is configured to exhibit an acoustic bandgap at the frequency of the resonance mode of vibration of the mechanical resonating structure, and wherein the anchor is oriented in a direction substantially parallel to a direction of propagation of the resonance mode of vibration of the mechanical resonating structure.

DETAILED DESCRIPTION

Some embodiments of the present disclosure relate to repetitively structured anchors (e.g., phononic crystal anchors) for resonators (e.g., suspended mechanical resonators). Some qualities of a resonator typically depend, at least in part, on properties of the anchors that couple the resonator's mechanical resonating structure to the resonator's substrate. For example, a resonator's quality factor of resonance (Q) and/or the extent to which the resonator exhibits spurious modes of resonance may depend on properties of the resonator's anchors, such as the locations where the anchors are coupled to the mechanical resonating structure, the acoustic properties of the anchors, and/or the shapes of the anchors. Anchors may provide acoustic, mechanical, and/or thermal insulation of the mechanical resonating structure, may suppress unwanted resonance modes of the mechanical resonating structure, and/or may provide paths for electrical wiring between the mechanical resonating structure and a substrate.

Disclosed herein are new anchor structures which may enhance a resonator's quality factor of resonance (Q) and/or suppress a resonator's spurious modes of resonance. Such anchors may exhibit an acoustic bandgap at the frequency of the resonator's primary mode of resonance, thereby trapping the energy of the resonator's primary mode of resonance on the mechanical resonating structure, rather than dissipating that energy into the substrate. Additionally or alternatively, such anchors may not exhibit an acoustic bandgap at a frequency of a spurious mode of resonance of the resonator, thereby facilitating dissipation of the energy of the resonator's spurious mode into the substrate. The suppression of a spurious mode by dissipation of the spurious mode's energy into the substrate may be further facilitated by configuring the anchors to exhibit a mode of resonance at the frequency of the resonator's spurious mode.

An anchor's ability to enhance a resonator's quality factor of resonance (Q) and/or suppress a resonator's spurious modes of resonance may depend on the anchor's shape. Disclosed herein are new anchor shapes suitable for enhancing a resonator's Q and/or suppressing the resonator's spurious modes of resonance. Also disclosed are techniques for determining an anchor's dimensions such that the anchor exhibits an acoustic bandgap at a desired frequency, and/or exhibits a mode of resonance at a desired frequency.

Repetitively structured anchors (e.g., anchors in which a same anchor structure is repeated one or more times) may be suitable for enhancing a resonator's quality factor of resonance (Q) and/or suppressing a resonator's spurious modes of resonance. Disclosed herein are new configurations of repetitively structured anchors suitable for enhancing a resonator's Q and/or suppressing the resonator's spurious modes of resonance. A repetitive structure which exhibits an acoustic bandgap over a range of frequencies may be referred to herein as a "phononic crystal."

In conventional resonators, anchors may be aligned perpendicular to the direction of propagation of the resonator's main mode of resonance. The inventors have appreciated that aligning repetitively structured anchors substantially in parallel with (rather than substantially perpendicular to) the direction of propagation of the resonator's main mode of resonance may reduce the chip area occupied by the resonator and increase the resonator's ability to withstand mechanical stress.

According to an aspect of the present disclosure, a mechanical resonating structure may exhibit a primary mode of resonance and one or more spurious modes of resonance. The mechanical resonating structure may be suspended and coupled to a substrate by at least one anchor. The anchor may exhibit an acoustic bandgap at the frequency of the resonator's primary mode of vibration. The anchor may not exhibit an acoustic bandgap at one or more frequencies of the one or more spurious modes. The anchor may exhibit a mode of resonance at one or more frequencies of the resonator's one or more spurious modes of resonance. The anchor may comprise a phononic crystal.

According to an aspect of the present disclosure, a mechanical resonating structure may exhibit a primary mode of resonance. The mechanical resonating structure may be suspended and coupled to a substrate by at least one anchor. The anchor may exhibit an acoustic bandgap at the frequency of the mechanical resonating structure's primary mode of resonance. The anchor may be oriented in a direction substantially parallel to a direction of propagation of the mechanical resonating structure's primary mode of resonance. The anchor may comprise a phononic crystal. The aspect ratio and chip area of the mechanical resonating structure and the anchors, in combination, may not be significantly greater than the aspect ratio and chip area of the mechanical resonating structure alone.

The various aspects described above, as well as further aspects, will now be described in detail below. It should be appreciated that these aspects may be used alone, all together, or in any combination of two or more, to the extent that they are not mutually exclusive.

Figure 1B:
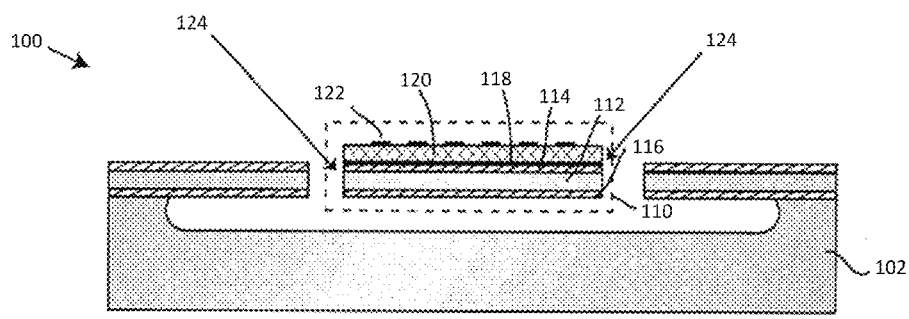

FIGS. 1A and 1B provide a perspective view and a more detailed cross-sectional view, respectively, of a device 100 including a micromechanical resonating structure 110 (reference number shown in FIG. 1B) to which aspects of the present application may apply. As illustrated, the micromechanical resonating structure 110 may include an active layer 120 (e.g., a piezoelectric layer, for example made of aluminum nitride, or any other suitable piezoelectric material), a conducting layer 118 (e.g., a metal electrode), and one or more electrodes 122 (which may, in some embodiments may be configured as top electrodes). A contact pad 128 may provide electrical access to the electrodes 122. The conducting layer 118 may, in some embodiments, be configured as an electrode, and may therefore in some embodiments be considered a bottom electrode. Electrical access to the conducting layer may be provided by a portion of the conducting layer located below the contact pad 128. For example, the portion of the conducting layer located below the contact pad 128 may be made larger than the contact pad 128, allowing for separate electrical contact to be made to the contact pad 128 and the portion of the conducting layer 118 located below the contact pad. Alternatively, a separate contact pad (e.g., next to contact pad 128 or in any other suitable location) may provide electrical access to the conducting layer 118. Other alternatives are also possible. The active layer 120 may be actuated by applying a voltage/electric field thereto using electrodes 122 (formed, for example, of a metal) and bottom conducting layer 118, which in some embodiments may be configured as a ground plane. Not all the illustrated components are required and other components may be included in some embodiments, as the illustration provides a non-limiting example of a mechanical resonating structure.

The micromechanical resonating structure 110 also may include a silicon layer 112, a silicon oxide layer 114 on the top surface of the silicon layer 112, and a silicon oxide layer 116 on the bottom surface of the silicon layer 112. The combination of silicon layer 112 and silicon oxide layers 114 and 116 may operate as a temperature compensation structure (a temperature compensation stack in this configuration) to compensate temperature-induced changes in the frequency of operation of micromechanical resonating structure 110. It should be appreciated that the silicon layer 112 may be formed of any suitable semiconductor material, and that silicon is a non-limiting example described herein for purposes of illustration. Non-limiting alternatives include germanium, gallium arsenide, or other semiconductor materials. Thus, the use of silicon for layer 112 is not limiting. Similarly, layers 114 and 116 may be formed of any suitable material (e.g., other types of oxide than silicon oxide), as silicon oxide is a non-limiting example described herein for purposes of illustration. Also, as mentioned, not all the illustrated components are required and other components may be included in some embodiments, as the illustration provides a non-limiting example of a mechanical resonating structure. The set of layers that form the micromechanical resonating structure 110 may be referred to herein as a "resonator stack" or simply as a "stack."

The micromechanical resonating structure may be connected to a substrate 102 by two or more anchors. As shown in FIG. 1A, the micromechanical resonating structure 110 is connected to the substrate 102 by two anchors, 106a and 106b. The number of anchors is not limiting, as any suitable number may be used.

As mentioned, various types and forms of mechanical resonating structures may be used with the aspects of the present application, and FIGS. 1A and 1B provide only a non-limiting example. For example, the mechanical resonating structure may comprise or be formed of any suitable material(s) and may have any composition. According to some embodiments, the mechanical resonating structure may comprise a piezoelectric material (e.g., active layer 120). According to some embodiments, the mechanical resonating structure comprises quartz, $LiNbO_3$, $LiTaO_3$, aluminum nitride (AlN), or any other suitable piezoelectric material (e.g., zinc oxide (ZnO), cadmium sulfide (CdS), lead titanate ($PbTiO_3$), lead zirconate titanate (PZT), potassium niobate ($KNbO_3$), $Li_2B_4O_7$, langasite ($La_3Ga_5SiO_{14}$), gallium arsenide (GaAs), barium sodium niobate, bismuth germanium oxide, indium arsenide, indium antimonide), either in substantially pure form or in combination with one or more other materials. Moreover, in some embodiments in which the mechanical resonating structure comprises a piezoelectric material, the piezoelectric material may be single crystal material, although in other embodiments including a piezoelectric material the piezoelectric material may be polycrystalline.

The mechanical resonating structure may have any shape, as the shape illustrated in FIGS. 1A and 1B is a non-limiting example. For example, aspects of the technology may apply to mechanical resonating structures that are substantially rectangular, substantially ring-shaped, substantially disc-shaped, or that have any other suitable shape. As additional, non-limiting examples, the configuration of the mechanical resonating structure can include, for example, any antenna type geometry, as well as beams, cantilevers, free-free bridges, free-clamped bridges, clamped-clamped bridges, discs, rings, prisms, cylinders, tubes, spheres, shells, springs, polygons, diaphragms and tori. Moreover, the mechanical resonating structure may have one or more beveled edges. According to some embodiments, the mechanical resonating structure may be substantially planar. Moreover, geometrical and structural alterations can be made to improve quality (e.g., quality factor (Q), noise) of a signal generated by the mechanical resonating structure.

The mechanical resonating structures described herein may have any suitable dimensions, and in some embodiments may be micromechanical resonating structures. A mechanical resonating structure may have any suitable thickness, T, and in some embodiments the thickness may be related to a wavelength of a desired oscillation mode. According to a non-limiting embodiment, the thickness T may be less than $2\lambda$, less than $\lambda$, less than $\frac{1}{2}\lambda$, less than $\frac{1}{4}\lambda$, less than $\frac{1}{8}\lambda$, or any other suitable value, where $\lambda$ is a wavelength of operation of the mechanical resonating structure (e.g., a wavelength of a resonance mode of interest of a mechanical resonating structure, an acoustic wavelength of a Lamb wave of interest, etc.). According to a non-limiting embodiment, the mechanical resonating structure may be configured to excite and/or support Lamb waves, and T may be less than $2\lambda$, less than $\frac{1}{2}\lambda$, or have any other suitable value.

According to some embodiments, the mechanical resonating structures described herein have a large dimension (e.g., the largest of length, width, diameter, circumference, etc. of the mechanical resonating structure) of less than approximately 1000 microns, less than approximately 500 microns, less than approximately 100 microns, less than approximately 50 microns, or any other suitable value. As a specific example, the resonator may have at least one critical dimension (impacting the resonance frequency of the resonator) of size 500 microns or less. It should be appreciated, however, that other sizes are also possible. According to some embodiments, the devices described herein form part or all of a microelectromechanical system (MEMS).

According to some embodiments, the mechanical resonating structures described herein may have any desired resonance frequencies and frequencies of operation, and may be configured to provide output signals of any desired frequencies. For example, the resonance frequencies and/or frequencies of operation of the mechanical resonating structures, and the frequencies of the output signals provided by the mechanical resonating structures, may be between 1 kHz and 10 GHz. In some embodiments, they may be in the upper MHz range (e.g., greater than 100 MHz), or at least 1 GHz (e.g., between 1 GHz and 10 GHz). In some embodiments, they may be at least 1 MHz (e.g., 13 MHz, 26 MHz, 76.5 MHz, 76.6 MHz) or, in some cases, at least 32 kHz. In some embodiments, they may be in the range of 30 to 35 kHz, 60 to 70 kHz, 10 MHz to 1 GHz, 1 GHz to 3 GHz, 3 GHz to 10 GHz, or any other suitable frequencies. Thus, it should be appreciated that the listed frequencies are not limiting.

The mechanical resonating structures may be configured to excite various resonance modes and/or to exhibit various resonance modes. A mechanical resonating structure may be said to be configured to exhibit a resonance mode when the mechanical resonating structure is configured to support excitation of the resonance mode and/or to resonate in the resonance mode. The resonance modes may include, but are not limited to in-plane resonance modes, out-of-plane resonance modes, flexural resonance modes, Lamb wave resonance modes, symmetric Lamb wave resonance modes, anti-symmetric Lamb wave resonance modes, bulk acoustic waves, surface acoustic waves, extensional modes, translational modes and/or torsional modes. The selected mode may depend on a desired application of the mechanical resonating structure.

The mechanical resonating structure may be actuated and/or detected in any suitable manner, with the particular type of actuation and/or detection depending on the type of mechanical resonating structure, the desired operating characteristics (e.g., desired mode of operation, frequency of operation, etc.), or any other suitable criteria. For example, suitable actuation and/or detection techniques include, but are not limited to, piezoelectric techniques, electrostatic techniques, magnetic techniques, thermal techniques, piezoresistive techniques, any combination of those techniques listed, or any other suitable techniques. The various aspects of the technology described herein are not limited to the manner of actuation and/or detection.

According to some embodiments, the mechanical resonating structures described herein may be piezoelectric Lamb wave devices, such as piezoelectric Lamb wave resonators. Such Lamb wave devices may operate based on propagating acoustic waves, with the edges of the structure serving as reflectors for the waves. For such devices, the spacing between the edges of the resonating structure may define the resonance cavity, and resonance may be achieved when the cavity is an integer multiple of p, where $p=\lambda/2$, with $\lambda$ being the acoustic wavelength of the Lamb wave of interest, understanding that the device may excite and/or support more than one mode of Lamb waves. However, it should be appreciated that aspects of the technology described herein apply to other types of structures as well, and that Lamb wave structures are merely non-limiting examples.

As should be appreciated from FIGS. 1A and 1B, in some embodiments suspended mechanical resonating structures are used, meaning that one or more sides or ends of the mechanical resonating structure(s) may be free, and/or that portions of one or more sides or ends of the mechanical resonating structure(s) may be free. Referring to FIG. 1A, the micromechanical resonating structure 110 has free ends 124 and the sides 126 are also substantially free, connected to the substrate 102 by anchors 106a and 106b.

Figure 2:
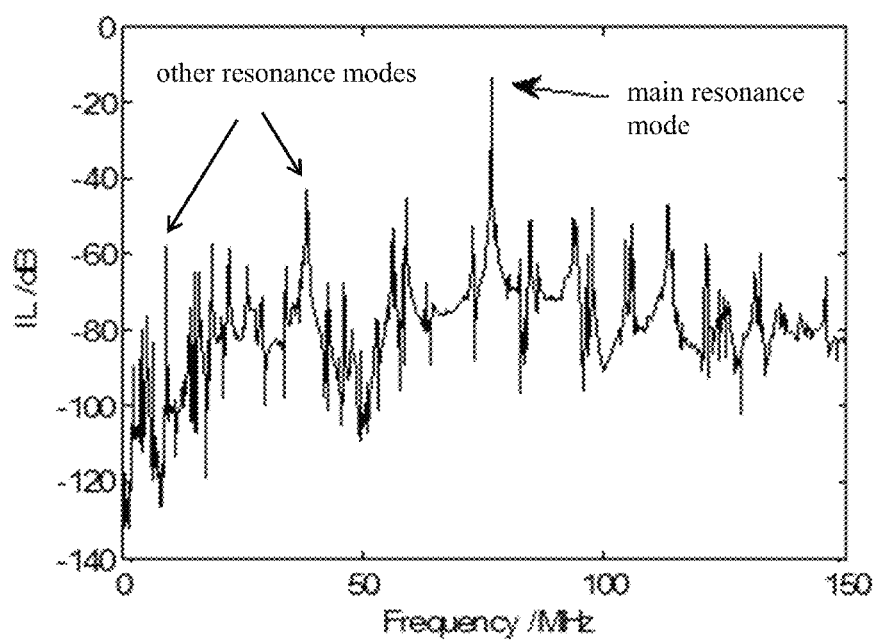
FIG. 2 illustrates insertion loss (IL) of a resonator, according to a non-limiting embodiment.

When measuring the electrical response (e.g., frequency response) of a resonator (e.g., MEMS resonator), e.g., in terms of scattering parameters, an excitable mode may appear as a resonance peak with a corresponding insertion loss (IL). FIG. 2 shows a non-limiting example of the frequency spectrum of the insertion loss (IL) of a resonator over a wide frequency range. In the example of FIG. 2, the resonator is a Lamb wave MEMS resonator. As indicated by the spectrum of FIG. 2, the resonator is configured to excite and exhibit many other resonance modes in addition to the primary resonance mode.

Figure 3A:
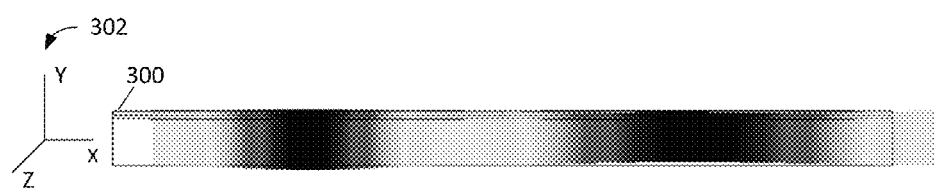
FIG. 3A shows the cross-sectional shape of a symmetric resonance mode of a resonator, according to a non-limiting embodiment.
Figure 3B:
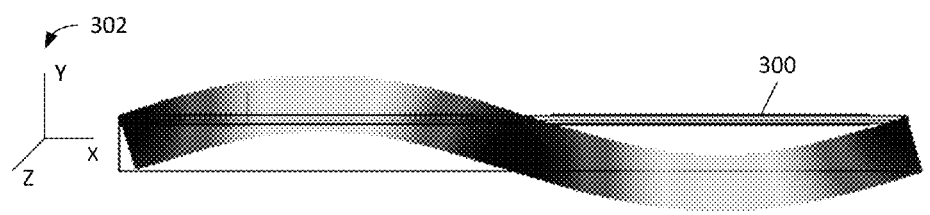
FIG. 3B shows the cross-sectional shape of an anti-symmetric resonance mode of a resonator, according to a non-limiting embodiment.

FIGS. 3A and 3B show one wavelength of the cross-sectional view of symmetric and anti-symmetric resonance modes, respectively, of a Lamb wave resonator 300, according to some embodiments. The cross-sectional mode shapes may be obtained using finite element method (FEM) simulation. In the examples of FIGS. 3A and 3B, black or dark grey areas represent areas of the resonator with small total displacement (e.g., nodes), and white or light grey areas represent areas of the resonator with large displacement. In the examples of FIGS. 3A and 3B, the displayed mode number (e.g., number of half-wavelengths in a lateral direction) is two. Because of weak frequency dispersion, high electromechanical coupling, and other properties, a Lamb mode $S_0$ (e.g., a fundamental symmetric Lamb mode) of the resonator of FIG. 3A may be used as primary resonance mode in a MEMS resonator. This mode is sometimes denoted as length-extensional or contour mode vibration, as displacement is predominantly in-plane (e.g., displacement occurs predominantly in the X-Z plane of axes 302). In contrast to the $S_0$ mode, the Lamb mode $A_0$ (e.g., a fundamental anti-symmetric Lamb mode), sometimes also denoted as a flexural mode, has a displacement predominantly out-of-plane (e.g., displacement occurs predominantly out of the X-Z plane of axes 302), which can be observed in FIG. 3B by the illustrated displacement in the y-direction.

Figure 4:
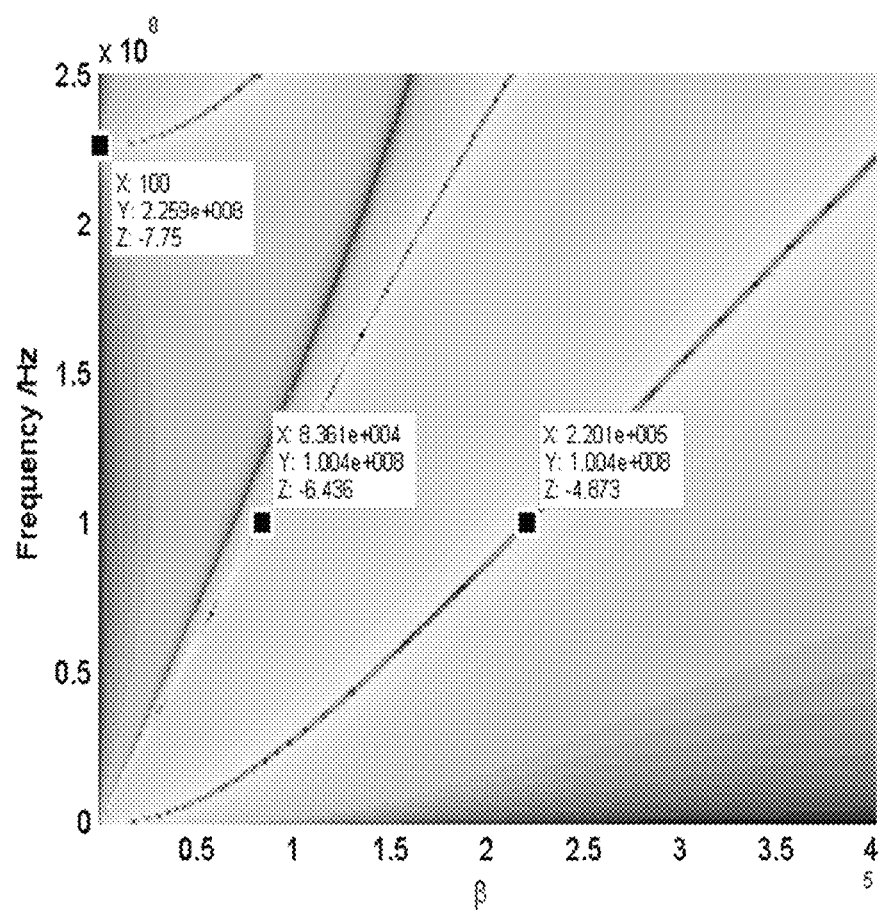
FIG. 4 shows a typical dispersion of the lowest order symmetric and anti-symmetric modes of vibration of a resonator, according to a non-limiting embodiment.

FIG. 4 shows a typical stack dispersion of modes $S_0$ and $A_0$ as frequency f vs. lateral wavenumber $\beta$. In some embodiments, $S_0$ and $A_0$ may be the lowest-order symmetric Lamb wave mode and the lowest-order anti-symmetric Lamb wave mode of a MEMS resonator. FIG. 4 illustrates that the wavelength of the $A_0$ mode varies strongly with frequency. As resonances occur at multiples n of half of the lateral wavelength $\lambda=2\pi/\beta$, FIG. 4 illustrates that resonance frequencies of the $A_0$ mode with mode order N occur at much lower frequencies than for the $S_0$ mode with the same mode order N.

FIGS. 5A-5G show several anchor structures 502a-g, according to some embodiments. In some embodiments, an anchor structure, including, but not limited to, any of the anchor structures 502a-502g, may be configured to exhibit an acoustic bandgap at a frequency of a mode of vibration of the mechanical resonating structure to which the anchor is coupled. In some embodiments, the acoustic bandgap of an anchor structure may include the frequency of a primary (or "main") mode of vibration of the mechanical resonating structure.

Alternatively or additionally, some embodiments of an anchor structure may be configured to not exhibit an acoustic bandgap at a frequency of a mode of vibration of the mechanical resonating structure to which the anchor is coupled. In some embodiments, the acoustic bandgap(s) of the anchor structure may exclude one or more frequencies of one or more spurious modes of vibration of the mechanical resonating structure.

Alternatively or additionally, some embodiments of an anchor structure may be configured to exhibit a resonance mode (e.g., to support excitation of a resonance mode and/or to resonate in a resonance mode) at a frequency of a mode of vibration of the mechanical resonating structure. In some embodiments, the frequency of the mode of vibration exhibited by the anchor may be substantially equal to the frequency of a spurious mode of vibration of the mechanical resonating structure. Two frequencies may be substantially equal if the difference between the two frequencies is less than 10%, less than 5%, less than 3%, less than 2%, less than 1%, less than 0.5%, or less than 0.1%. In some embodiments, an anchor structure may be configured to exhibit resonance modes at multiple frequencies of respective modes of vibration of the mechanical resonating structure (e.g., frequencies of spurious modes of vibration of the mechanical resonating structure).

The frequencies corresponding to an acoustic bandgap exhibited by an anchor may be identified, for example, by obtaining the frequency versus lateral wavenumber dispersion of the anchor structure (e.g., by applying the Floquet-Bloch theorem over a range of wavenumbers, such as all wave-numbers ranging from $\Gamma$ to X). At frequencies where no eigenmode solutions exist (e.g., in the real wavenumber space), it may be difficult or impossible for acoustic waves to propagate through the anchor structure or through a repetitively structured anchor comprising a plurality of such anchor structures. At such frequencies, the anchor is said to exhibit an acoustic bandgap (e.g., a "phononic bandgap"). An anchor may exhibit zero, one, or two or more acoustic bandgaps.

Figure 5A:
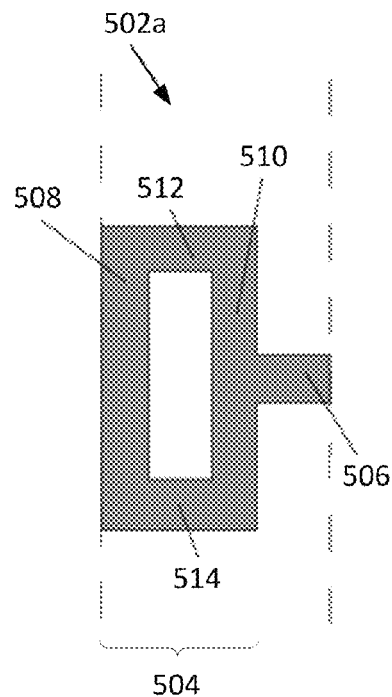
FIG. 5A is a schematic illustration of an anchor structure, according to some embodiments.

An acoustic bandgap may be complete or partial. At the frequency or frequencies corresponding to a complete acoustic bandgap, it may be difficult or impossible for acoustic waves of any mode to propagate through the anchor structure or through a repetitively structured anchor comprising a plurality of such anchor structures. At the frequency or frequencies corresponding to a partial acoustic bandgap, it may be difficult or impossible for acoustic waves of one or more particular modes (e.g., symmetric modes) to propagate through the anchor structure or through a repetitively structured anchor comprising a plurality of such anchor structures, but less difficult for acoustic waves of one or more other modes (e.g., anti-symmetric modes) to propagate through the anchor structure or through a repetitively structured anchor comprising a plurality of such anchor structures In some embodiments, an anchor may comprise an anchor structure 502a as illustrated in FIG. 5A. Anchor structure 502a may be referred to as a "tether structure." In some embodiments, anchor structure 502a may include a first part 504 and a second part 506. In some embodiments, the first part 504 may comprise a ring-shaped structure, including, but not limited to, a circular ring-shaped structure, an elliptical ring-shaped structure, a curved ring-shaped structure, a rectangular-ring shaped structure, and/or any other structure that forms a closed ring around a void of any suitable shape. In some embodiments, first part 504 may comprise cross-bars 508 and 510, and connecting elements 512 and 514 disposed between cross-bars 508 and 510. In some embodiments, the second part 506 may comprise a beam structure. An end of second part 506 may, in some embodiments, be connected to a portion of first part 504.

In some embodiments, anchor structure 502a may exhibit one or more acoustic bandgaps. In some embodiments, one or more acoustic bandgaps of anchor structure 502a may remain stable over a wide range of dimensions of portions of anchor structure 502a, consistent with typical high volume manufacturing tolerances. In some embodiments, anchor structure 502a may be compliant, thereby reducing stress on the mechanical resonating structure.

Whether an embodiment of anchor structure 502a exhibits an acoustic bandgap, and one or more properties of such an acoustic bandgap (e.g., the frequencies included in the acoustic bandgap, whether the acoustic bandgap is complete or partial, the resonance modes included in the acoustic bandgap, the sensitivity of the acoustic bandgap to typical variations in the dimensions of components of anchor structure 502a, etc.) may depend on the dimensions of one or more portions of anchor structure 502a. In some embodiments, anchor structure 502a may exhibit an acoustic bandgap for a resonance mode (e.g., an $S_0$ mode) having wavelength $\lambda$ (e.g., an in-plane, length-extensional, and/or symmetric resonance mode having wavelength $\lambda$) when the dimensions of anchor structure 502a satisfy one or more (e.g., all) of the following conditions:

(1) the larger dimension (e.g., length measured along a peripheral edge in a direction other than a thickness direction) of each of cross-bars 508 and 510 is between approximately $0.1\lambda$ and $0.9\lambda$;

(2) the smaller dimension (e.g., length measured along a peripheral edge in a direction other than a thickness direction) of each of cross-bars 508 and 510 is between approximately $0.02\lambda$ and $0.2\lambda$;

(3) the dimension (e.g., length measured along a peripheral edge in a direction other than a thickness direction) of each of connecting elements 512 and 514 in a direction substantially perpendicular to the direction of the larger dimension of cross-bar 508 or 510 is between approximately $0.02\lambda$ and $0.2\lambda$;

(4) the dimension (e.g., length measured along a peripheral edge in a direction other than a thickness direction) of each of connecting elements 512 and 514 in a direction substantially parallel to the direction of the larger dimension of cross-bar 508 or 510 is between approximately $0.02\lambda$ and $0.2\lambda$;

(5) the dimension (e.g., length measured along a peripheral edge in a direction other than a thickness direction) of second part 506 in a direction substantially perpendicular to the direction of the larger dimension of cross-bar 508 or 510 is between approximately $0.02\lambda$ and $0.5\lambda$; and/or (6) the dimension (e.g., length measured along a peripheral edge in a direction other than a thickness direction) of second part 506 in a direction substantially parallel to the direction of the larger dimension of cross-bar 508 or 510 is between approximately $0.02\lambda$ and $0.2\lambda$.

In some embodiments, anchor structure 502a may be configured to satisfy all six of the foregoing conditions. Such an anchor structure 502a may exhibit an acoustic bandgap for a resonance mode having wavelength $\lambda$ (e.g., an in-plane, length-extensional, and/or symmetric resonance mode having wavelength $\lambda$).

For an out-of-plane/flexural/anti-symmetric (e.g., a fundamental anti-symmetric or "$A_0$" mode), the respective wavenumber-frequency dispersion is complex. FIGS. 3A-3B and 4 show an exemplary displacement and dispersion of an $A_0$ mode and $S_0$ mode in a typical MEMS resonator stack. It can be seen that no clear relation between $S_0$ and $A_0$ wave number/wave length can be given; instead it could be obtained from FIG. 4 for this specific stack. It should be appreciated that above given parameter ranges in terms of $\lambda$ of $S_0$ are as well suitable for acoustic band-gaps of the $S_0$ and $A_0$ mode.

Figure 5B:
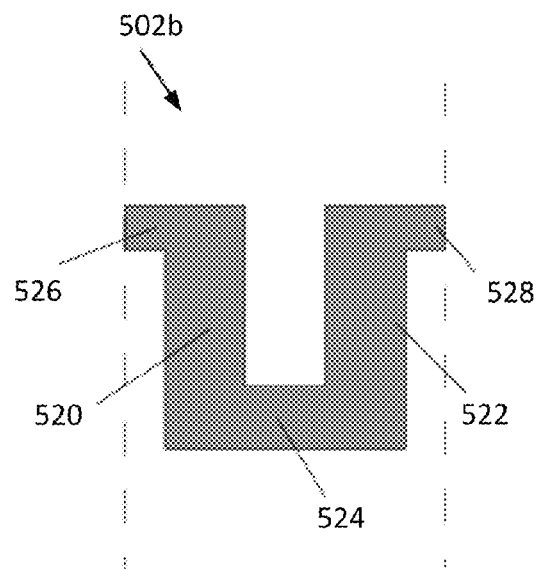
FIG. 5B is a schematic illustration of another anchor structure, according to some embodiments.

In some embodiments, an anchor may comprise an anchor structure 502b as illustrated in FIG. 5B. Anchor structure 502b may be referred to as a "meandering structure." In some embodiments, anchor structure 502b may include a first crossbar 520 and a second crossbar 522. In some embodiments, the first and second crossbars 520 and 522 may be substantially parallel. In some embodiments, anchor structure 502b may include a beam 524 connecting first ends of first and second crossbars 520 and 522. In some embodiments, anchor structure 502b may include a beam 526 connected to a second end of the first cross bar and extending away from the second crossbar. In some embodiments, anchor structure 502b may include a beam 528 connected to a second end of the second cross bar and extending away from the first crossbar. As can be seen in FIG. 5B, embodiments of anchor structure 502b may not be symmetric.

In some embodiments, anchor structure 502b may exhibit one or more acoustic bandgaps. In some embodiments, an acoustic bandgap exhibited by anchor structure 502b may be a partial acoustic bandgap for an anti-symmetric resonance mode. In some embodiments, one or more acoustic bandgaps of anchor structure 502b may remain stable over a wide range of dimensions of portions of anchor structure 502b, consistent with typical high volume manufacturing tolerances. In some embodiments, anchor structure 502b may be more compliant than anchor structure 502a.

Whether an embodiment of anchor structure 502b exhibits an acoustic bandgap, and one or more properties of such an acoustic bandgap (e.g., the frequencies included in the acoustic bandgap, the resonance modes included in the acoustic bandgap, the sensitivity of the acoustic bandgap to typical variations in the dimensions of components of anchor structure 502a, etc.) may depend on the dimensions of one or more portions of anchor structure 502b. In some embodiments, anchor structure 502b may exhibit an acoustic bandgap for a resonance mode having wavelength λ (e.g., an out-of-plane, flexural, and/or anti-symmetric resonance mode having wavelength λ) when the dimensions of anchor structure 502b satisfy one or more (e.g., all) of the following conditions:

(1) the larger dimension (e.g., length measured along a peripheral edge in a direction other than a thickness direction) of each of cross-bars 520 and 522 is between approximately 0.1λ and 1.0λ;

(2) the smaller dimension (e.g., length measured along a peripheral edge in a direction other than a thickness direction) of each of cross-bars 520 and 522 is between approximately 0.02λ and 0.2λ;

(3) the dimension (e.g., length measured along a peripheral edge in a direction other than a thickness direction) of connecting elements 524 in a direction substantially perpendicular to the direction of the larger dimension of cross-bar 520 or 522 is between approximately 0.02λ and 0.5λ;

(4) the dimension (e.g., length measured along a peripheral edge in a direction other than a thickness direction) of connecting element 524 in a direction substantially parallel to the direction of the larger dimension of cross-bar 520 or 522 is between approximately 0.02λ and 0.2λ;

(5) the dimension (e.g., length measured along a peripheral edge in a direction other than a thickness direction) of each of beams 526 and 528 in a direction substantially perpendicular to the direction of the larger dimension of cross-bar 520 or 522 is between approximately 0.02λ and 0.5λ;

(6) the dimension (e.g., length measured along a peripheral edge in a direction other than a thickness direction) of each of beams 526 and 528 in a direction substantially parallel to the direction of the larger dimension of cross-bar 508 or 510 is between approximately 0.02λ and 0.2λ; and/or (7) the ratio of the thickness of the mechanical resonating structure to the wavelength λ of the resonance mode is between approximately 0.01 and 0.3.

In some embodiments, anchor structure 502b may satisfy the first six foregoing conditions or all seven foregoing conditions. Such an anchor structure 502b may exhibit an acoustic bandgap for a resonance mode having wavelength λ (e.g., an out-of-plane, flexural, and/or anti-symmetric resonance mode having wavelength λ).

In some embodiments, an anchor may comprise an anchor structure 502c-502g as illustrated in FIGS. 5C-5G, respectively, or any other anchor structure configured to exhibit an acoustic bandgap (e.g., an acoustic bandgap comprising a frequency of a main resonance mode of a resonator).

Figure 6:
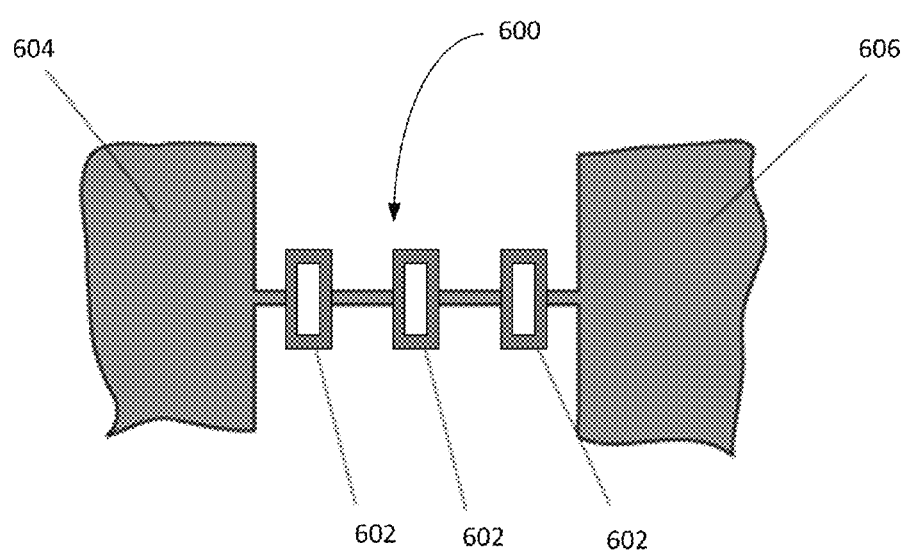
FIG. 6 is a schematic illustration of a repetitively structured anchor, according to some embodiments.

FIG. 6 shows a repetitively structured anchor 600, according to some embodiments. In the example of FIG. 6, repetitively structured anchor 600 may be coupled between a mechanical resonating structure 604 and a substrate 606. In some embodiments, repetitively structured anchor 600 may be configured to exhibit an acoustic bandgap. In some embodiments, a repetitively structured anchor 600 may include two or more anchor structures 602. In some embodiments, the anchor structures 602 may have substantially the same shape and/or exhibit at least the acoustic bandgap of repetitively structured anchor 600. In some embodiments, the acoustic bandgap of repetitively structured anchor 600 may include a frequency of a main resonance mode of mechanical resonating structure 604. In some embodiments, the acoustic bandgap of repetitively structured anchor 600 may not include at least one spurious resonance mode of mechanical resonating structure 604.

In some embodiments, repetitively structured anchor 600 may be configured to exhibit resonance modes at one or more frequencies of respective modes of vibration of mechanical resonating structure 604 (e.g., frequencies of spurious modes of vibration of the mechanical resonating structure). In some embodiments, the one or more frequencies of the one or more modes of vibration of repetitively structured anchor 600 may be determined, at least in part, by the shapes and dimensions of the anchor structures 602 that form anchor 600. In some embodiments, two or more anchor structures 602 of anchor 600 may have similar shapes but different dimensions.

In some embodiments, anchor structure 602 may comprise any one of the anchor structures 502a-502g illustrated in FIGS. 5A-5G, or any other anchor structure configured to exhibit an acoustic bandgap (e.g., an acoustic bandgap comprising a frequency of a main resonance mode of mechanical resonating structure 604).

Relative to using an anchor including a single anchor structure 602, using a repetitively structured anchor including two or more anchor structures 602 may improve the quality factor of resonance (Q) of mechanical resonating structure 604, because replicating the anchor structure 602 may reduce acoustic losses via anchor 600 for resonance modes included in the anchor's acoustic bandgap. In some embodiments, the acoustic insulation, mechanical insulation, and/or thermal insulation of mechanical resonating structure 604 may tend to improve as the number of anchor structures 602 included in repetitively structured anchor 600 increases. In some embodiments, repetitively structured anchor 600 may include two or more, three or more, between three and five, between five and ten, between ten and twenty, or more than twenty anchor structures 602. In some embodiments, the number N of anchor structures 602 in repetitively structured anchor 600 may be sufficiently large such that the resonator's quality factor Q is dominated by non-acoustic losses (e.g., viscous losses and/or other losses). For example, in some embodiments, the number N of anchor structures 602 may be sufficiently large such that the ratio of $Q_{ACOUSTIC}$ to $Q_{TOTAL}$ is greater than 5, greater than 10, greater than 20, greater than 50, greater than 100, or greater than 1,000.

In some embodiments, repetitively structured anchor 600 comprises a phononic crystal (e.g., a one-dimensional phononic crystal). In some embodiments, the two or more anchor structures 602 may form at least a portion of the phononic crystal. In some embodiments, each of the two or more anchor structures 602 may be a "unit cell" of the repetitively structured anchor. The dashed lines in FIGS. 5A-5G may denote periodic boundaries of the respective anchor structures 502a-g.

In some embodiments, repetitively structured anchor 600 may be oriented in a direction substantially parallel to a direction of propagation of a resonance mode of mechanical resonating structure 604. A structure (e.g., an anchor) may be oriented in a direction substantially parallel to a direction of propagation of a resonance mode when an angle formed between a direction of the structure and the direction of propagation of the resonance mode is less than 10°, less than 5°, less than 3°, less than 2°, less than 1°, or less than 0.1°. In some embodiments, the direction of the anchor may be the direction of the longest dimension of the anchor. A dimension of the anchor may include a length, width, thickness, depth, or height of the anchor (e.g., a distance between two opposing surfaces of the anchor, measured along a line orthogonal to the opposing surfaces). In some embodiments, the direction of the anchor may be the direction of repetition of the unit cells of the repetitively structured anchor (e.g., the direction of a line intersecting each of the unit cells of the repetitively structured anchor).

Relative to orienting repetitively structured anchor 600 in a direction substantially perpendicular to a direction of propagation of a resonance mode of mechanical resonating structure 604, orienting anchor 600 in a direction substantially parallel to the direction of propagation of the resonance mode may reduce the die area occupied by the resonator, improve the mechanical stability (e.g., rotational stiffness) of the resonator, and/or reduce the aspect ratio of the resonator. In some embodiments, the aspect ratio of a resonator with one or more anchors 600 oriented in a direction substantially parallel to the direction of propagation of the resonance mode of mechanical resonating structure 604 may be less than 2, less than 1.8, less than 1.7, less than 1.6, or less than 1.5.

Figure 7:
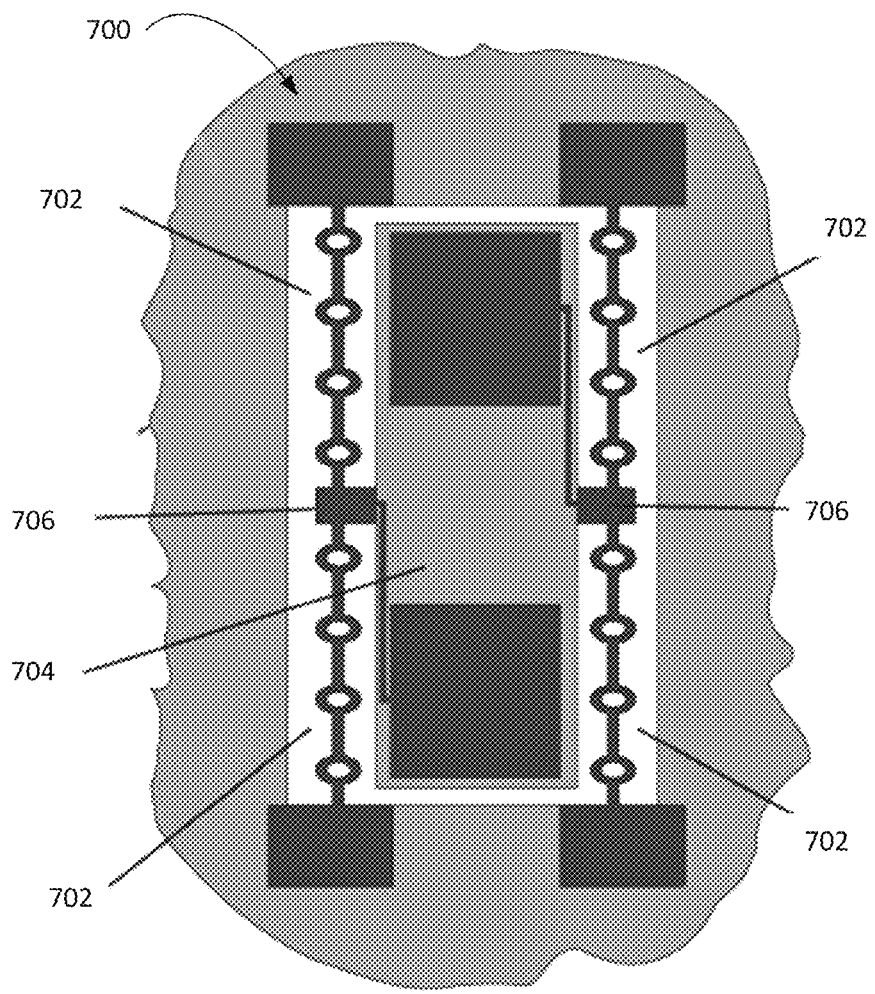
FIG. 7 is a schematic illustration of a mechanical resonator with a repetitively structured anchor, according to some embodiments.

FIG. 7 shows a resonator 700 with repetitively structured anchors 702 (e.g., phononic crystal anchors) oriented in a direction substantially parallel to the direction of propagation of the main resonance mode of a mechanical resonating structure 704. Each of the repetitively structured anchors may include two or more anchor structures 708. Anchor structure 708 may be any suitable anchor structure, including, but not limited to one of anchor structures 502a-g and/or any anchor structure exhibiting a suitable acoustic bandgap.

In some embodiments, each of the repetitively structured anchors 702 may be connected to a centerpiece 706. In some embodiments, centerpiece 706 may be connected to mechanical resonating structure 704 at the location of the symmetric center of vibration of mechanical resonating structure 704. Connecting the centerpiece 706 at the location of the symmetric center of vibration of the resonator may be particularly advantageous for a mechanical resonating structure 704 configured to exhibit a main resonance mode having symmetric vibration around the symmetry line of the mechanical resonating structure. Centerpiece 706 may have any suitable shape.

In some embodiments, anchor structure 708 may comprise any one of the anchor structures 502a-502g illustrated in FIGS. 5A-5G, or any other anchor structure configured to exhibit an acoustic bandgap (e.g., an acoustic bandgap comprising a frequency of a main resonance mode of mechanical resonating structure 704).

Each of FIGS. 8A-8D shows a resonator 800 with repetitively structured anchors 802 (e.g., phononic crystal anchors) oriented in a direction substantially parallel to the direction of propagation of the main resonance mode of a mechanical resonating structure 804.

In the embodiment of FIG. 8A, repetitively structured anchor 802a may be coupled to mechanical resonating structure 804a at a node of the main mode of the mechanical resonating structure. The anchor configuration of FIG. 8A may be advantageous when the main resonance mode is a symmetric mode (e.g., an even-order symmetric mode).

In the embodiment of FIG. 8B, repetitively structured anchor 802b may be coupled to mechanical resonating structure 804b at a node of the main resonance mode of the mechanical resonating structure. The anchor configuration of FIG. 8B may be advantageous when the main resonance mode is an anti-symmetric mode (e.g., an even-order anti-symmetric mode, a mode that is anti-symmetric with respect to the resonator's line of symmetry, and/or an anti-symmetric mode that has no nodes on the resonator's line of symmetry).

In the embodiment of FIG. 8C, repetitively structured anchor 802c may be coupled to mechanical resonating structure 804c at a node of the main resonance mode of the mechanical resonating structure and may extend toward the resonator's line of symmetry to connect to a centerpiece 806 coupled to the substrate. The anchor configuration of FIG. 8C may be advantageous (e.g., in terms of stress sensitivity) when the main resonance mode is an even-order mode.

In the embodiment of FIG. 8D, repetitively structured anchor 802d may include two or more repetitive portions 810 substantially parallel to each other and connected by connection elements 812. Anchor 802d may be coupled to mechanical resonating structure 804d via a centerpiece 814 at the location of the symmetric center of vibration of the mechanical resonating structure. The anchor configuration of FIG. 8D may increase the acoustic, thermal, and/or mechanical insulation of mechanical resonating structure 804d by increasing the number of anchor structures in the repetitively structured anchor.

In some embodiments, each of anchor structures 802a-802d may comprise any one of the anchor structures 502a-502g illustrated in FIGS. 5A-5G, or any other anchor structure configured to exhibit an acoustic bandgap (e.g., an acoustic bandgap comprising a frequency of a main resonance mode of corresponding mechanical resonating structure 804a-804d).

Additional Description of Some Aspects of the Present Disclosure

The resonant frequency of a resonator (e.g., a MEMS resonator) may depend on the resonator's frequency. Thus, variation in the temperature of a resonator may lead to variation or instability in the resonator's resonance frequency. In some embodiments an electrical heater may be co-located with a resonator (e.g., disposed on or integrated with the resonator's mechanical resonating structure) to regulate the resonator's temperature. In some embodiments, a sensor (e.g., temperature sensor or frequency sensor) may be co-located with a resonator (e.g., disposed on or integrated with the resonator's mechanical resonating structure) to sense the resonator's temperature and/or frequency and to control systems that regulate the resonator's temperature and/or frequency.

Resonator anchors may be configured to thermally insulate a mechanical resonating structure from its ambient environment. Also, resonator anchors may be configured to facilitate routing of electrical signals (e.g., via electrical wires or traces) between a mechanical resonating structure and other portions of a chip. Anchoring techniques suitable for thermally insulating a mechanical resonating structure and/or for routing electrical signals between a mechanical resonating structure and other portions of a chip are disclosed in U.S. Provisional Patent Application Ser. No. 61/745,116, entitled "RESONATORS COMPRISING PHONONIC CRYSTALS" filed on Dec. 21, 2012, which is incorporated herein by reference in its entirety.

It should be understood that the various embodiments shown in the Figures are illustrative representations, and are not necessarily drawn to scale. Reference throughout the specification to "one embodiment" or "an embodiment" or "some embodiments" means that a particular feature, structure, material, or characteristic described in connection with the embodiment(s) is included in at least one embodiment, but not necessarily in all embodiments. Consequently, appearances of the phrases "in one embodiment," "in an embodiment," or "in some embodiments" in various places throughout the Specification are not necessarily referring to the same embodiment.

Unless the context clearly requires otherwise, throughout the disclosure, the words "comprise," "comprising," and the like are to be construed in an inclusive sense as opposed to an exclusive or exhaustive sense; that is to say, in a sense of "including, but not limited to." Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list; all of the items in the list; and any combination of the items in the list.

Having thus described several aspects of at least one embodiment of the technology, it is to be appreciated that various alterations, modifications, and improvements will readily occur to those skilled in the art. Such alterations, modifications, and improvements are intended to be within the spirit and scope of the technology. Accordingly, the foregoing description and drawings provide non-limiting examples only.

The invention claimed is:

1. An apparatus comprising:
a substrate;
a micro-electromechanical systems (MEMS) resonating structure configured to resonate in an in-plane mode of vibration at a first frequency and to resonate in a second mode of vibration at a second frequency; and
a phononic crystal anchor coupling the MEMS resonating structure to the substrate, oriented in a first direction substantially parallel to a direction of propagation of the in-plane mode of vibration of the MEMS resonating structure, and overlapping the MEMS resonating structure along a second direction substantially perpendicular to the first direction, wherein the phononic crystal anchor is configured to exhibit an acoustic bandgap at the first frequency of the in-plane mode of vibration of the MEMS resonating structure and is further configured to resonate in a mode of vibration at a frequency substantially equal to the second frequency of the second mode of vibration of the MEMS resonating structure.

2. An apparatus comprising:
a substrate;
a mechanical resonating structure configured to resonate in a first mode of vibration at a first frequency and to resonate in a second mode of vibration at a second frequency; and
an anchor coupling the mechanical resonating structure to the substrate and oriented in a direction substantially parallel to a direction of propagation of the first mode of vibration of the MEMS resonating structure, wherein the anchor is configured to exhibit an acoustic bandgap at the first frequency of the first mode of vibration of the mechanical resonating structure and is further configured to not exhibit an acoustic bandgap at the second frequency of the second mode of vibration of the mechanical resonating structure, and wherein the anchor is oriented in a first direction substantially parallel to a direction of propagation of the resonance mode of vibration of the mechanical resonating structure, and overlaps the mechanical resonating structure along a second direction substantially perpendicular to the first direction.

3. The apparatus of claim 2, wherein the anchor comprises a first structure and a second structure, the first and second structures having substantially a same shape, and wherein the first and second structures form at least a portion of a phononic crystal.

4. The apparatus of claim 2, wherein the anchor comprises a first part and a second part, the first part comprising a ring-shaped structure, the second part comprising a beam structure, an end of the beam structure being connected to a portion of the ring-shaped structure.

5. The apparatus of claim 4, wherein the ring-shaped structure comprises a rectangular ring-shaped structure.

6. The apparatus of claim 2, wherein the anchor comprises first and second crossbars, the first and second crossbars being substantially parallel, a beam connecting first ends of the first and second crossbars, a beam connected to a second end of the first cross bar and extending away from the second crossbar, and a beam connected to a second end of the second cross bar and extending away from the first crossbar.

7. The apparatus of claim 2, wherein the second mode of vibration of the mechanical resonating structure comprises a symmetric mode, and wherein a mode of vibration of the anchor comprises a symmetric mode.

8. The apparatus of claim 2, wherein the second mode of vibration of the mechanical resonating structure comprises an anti-symmetric mode, and wherein a mode of vibration of the anchor comprises an anti-symmetric mode.

9. The apparatus of claim 2, wherein the second mode of vibration of the mechanical resonating structure comprises an in-plane mode, and wherein a mode of vibration of the anchor comprises an in-plane mode.

10. The apparatus of claim 2, wherein the mechanical resonating structure is configured to resonate in a third mode of vibration at a third frequency, and wherein the anchor is configured to resonate in a mode of vibration at a frequency substantially equal to the third frequency of the third mode of vibration of the mechanical resonating structure.

11. The apparatus of claim 2, wherein the first mode of vibration of the mechanical resonating structure comprises an in-plane resonance mode.

12. The apparatus of claim 2, further comprising a micro-electromechanical system (MEMS) resonator, wherein the MEMS resonator includes the mechanical resonating structure, and wherein the first mode of vibration of the mechanical resonating structure comprises a Lamb wave resonance mode.

13. The apparatus of claim 2, wherein the anchor is configured to resonate in a mode of vibration at a frequency substantially equal to the second frequency of the second mode of vibration of the mechanical resonating structure.

14. An apparatus comprising:
a substrate;
a mechanical resonating structure configured to resonate in a resonance mode of vibration at a frequency; and
an anchor coupling the mechanical resonating structure to the substrate, wherein the anchor is configured to exhibit an acoustic bandgap at the frequency of the resonance mode of vibration of the mechanical resonating structure, and wherein the anchor is oriented in a first direction substantially parallel to a direction of propagation of the resonance mode of vibration of the mechanical resonating structure, and overlaps the mechanical resonating structure along a second direction substantially perpendicular to the first direction.

15. The apparatus of claim 14, wherein the anchor comprises a first structure and a second structure, the first and second structures having substantially a same shape, and wherein the first and second structures form at least a portion of a phononic crystal.

16. The apparatus of claim 14, wherein the anchor is further configured to resonate in a mode of vibration at a frequency substantially equal to a second frequency of a second mode of vibration of the mechanical resonating structure.

17. The apparatus of claim 14, wherein a larger dimension of a smallest rectangular area enclosing the mechanical resonating structure and the anchor is less than two times greater than a smaller dimension of the smallest rectangular area enclosing the mechanical resonating structure.

18. The apparatus of claim 14, wherein the anchor is connected to the mechanical resonating structure at a symmetric center of vibration of the mechanical resonating structure.

19. The apparatus of claim 14, wherein the anchor is connected to the mechanical resonating structure at a node of the resonance mode of vibration of the mechanical resonating structure.

20. The apparatus of claim 1, wherein the in-plane mode of vibration of the MEMS resonating structure comprises a Lamb wave resonance mode.

* * * * *